US005419998A

United States Patent [19]
Mayes et al.

[11] Patent Number: 5,419,998
[45] Date of Patent: May 30, 1995

[54] PHOTOPOLYMERIZABLE COMPOSITION FOR USE IN AN ALKALINE-ETCH RESISTANT DRY FILM PHOTORESIST

[75] Inventors: Richard T. Mayes, Newark; Rudolph L. Pohl, Wilmington, both of Del.

[73] Assignee: Hercules Incorporated, Wilmington, Del.

[21] Appl. No.: 279,986

[22] Filed: Jul. 25, 1994

Related U.S. Application Data

[63] Continuation of Ser. No. 68,571, May 27, 1993, abandoned, which is a continuation of Ser. No. 751,833, Aug. 30, 1991, abandoned.

[51] Int. Cl.$^6$ .............................................. G03F 7/033
[52] U.S. Cl. ...................................... 430/288; 430/281; 430/905; 430/910
[58] Field of Search ............... 430/258, 281, 910, 905, 430/288

[56] References Cited

U.S. PATENT DOCUMENTS

| | | | |
|---|---|---|---|
| 3,264,272 | 8/1966 | Rees | 260/78.5 |
| 3,466,208 | 9/1969 | Slominski | 156/18 |
| 3,469,982 | 9/1969 | Celeste | 96/35.1 |
| 3,705,061 | 12/1972 | King | 156/19 |
| 3,804,631 | 4/1974 | Faust | 96/115 |
| B1 3,887,450 | 6/1983 | Gilano et al. | 204/159.15 |
| B1 3,953,309 | 4/1983 | Gilano et al. | 204/159.16 |
| 4,180,598 | 12/1979 | Emmons | 427/44 |
| 4,239,849 | 12/1980 | Lipson et al. | 430/281 |
| 4,268,610 | 5/1981 | Roos | 430/281 |
| 4,293,635 | 10/1981 | Flint et al. | 430/271 |
| 4,293,849 | 10/1981 | Lacy | 340/365 |
| 4,297,435 | 10/1981 | Jolly et al. | 430/270 |
| 4,539,286 | 9/1985 | Lipson et al. | 430/277 |
| 4,629,680 | 12/1986 | Iwasaki et al. | 430/288 |
| 4,686,171 | 8/1987 | Fifield et al. | 430/273 |
| 4,692,396 | 9/1987 | Uchida | 430/284 |
| 4,777,115 | 10/1983 | Koch et al. | 430/281 |
| 4,925,768 | 5/1990 | Iwasaki et al. | 430/271 |
| 4,985,343 | 1/1991 | Kushi et al. | 430/285 |
| 5,182,187 | 1/1993 | Geissler et al. | 430/271 |

FOREIGN PATENT DOCUMENTS

| | | | |
|---|---|---|---|
| 0164270 | 9/1985 | European Pat. Off. . | |
| 0217137 | 8/1986 | European Pat. Off. . | |
| 0237309 | 3/1987 | European Pat. Off. . | |
| 0382524 | 8/1990 | European Pat. Off. | 430/910 |

OTHER PUBLICATIONS

C. F. Coombs, Jr., Printed Circuits Handbook (Third Ed.) pp. 12.38–12.40 and 14.1–14.36.

*Primary Examiner*—Charles L. Bowers, Jr.
*Assistant Examiner*—John A. McPherson
*Attorney, Agent, or Firm*—Mark D. Kuller; Martin F. Sloan; Robert P. O'Flynn O'Brien

[57] ABSTRACT

In an aqueous-developable dry-film photoresist containing a carboxyl-group containing film-forming polymeric binder, the improvement wherein the binder is obtained by polymerizing a mixture including: (a) a monomer of the formula $H_2C=CRCOO[(C_nH_{2n})X(C_pH_{2p})]_mR'$, wherein R is hydrogen or methyl and R' is a saturated or unsaturated $C_5$-$C_{12}$ bridged alkyl optionally substituted by at least one $C_1$-$C_4$ alkyl or halogen, X is oxygen or sulfur, n is 2–4, p is 0–4, m is 0–2; and (b) at least one $C_3$-$C_{15}$ $\alpha,\beta$-unsaturated carboxyl-containing monomer having 3–15 carbon atoms.

17 Claims, No Drawings

PHOTOPOLYMERIZABLE COMPOSITION FOR USE IN AN ALKALINE-ETCH RESISTANT DRY FILM PHOTORESIST

This application is a continuation of application Ser. No. 08/068,571, filed May 27, 1993, now abandoned, which is a continuation of application Ser. No. 07/751,833, filed Aug. 30, 1991, now abandoned.

The present invention relates to aqueous-developable dry film photoresists. In particular, it relates to aqueous-developable dry film photoresists that contain a film-forming polymeric binder.

BACKGROUND OF THE INVENTION

Aqueous-developable dry-film photoresists are photopolymerizable compositions used in the manufacture of printed circuit boards. Such photoresists are generally made by applying the solvated resist material to a carrier, such as a transparent polyester film, and then evaporating the solvent to produce the dry film. In typical use, a dry-film photoresist is applied to a copper-clad substrate along with the carrier, exposed in certain areas through the carrier to actinic radiation that will cure the film, and then washed with an alkaline aqueous solution to remove the unexposed film from the copper. The exposed copper surface can then be removed in etching solutions leaving the protected area under the cured photoresist to form the electrical circuit.

Manufacturing operations such as alkaline etching and gold plating typically involve alkaline conditions that cause particular problems, such as loss of adhesion of the cured photoresist. Accordingly, it is important that the cured photoresist be tough enough to withstand such procedures.

It is also advantageous to have a photoresist that in unexposed areas is readily washed from the substrate in order to achieve as rapid a development time as possible. To facilitate easy removal of uncured photoresist, one of the ingredients in photoresists is a carboxyl-group containing film-forming polymeric binder.

However, a delicate balance of ingredients must be maintained in photoresist formulations. Materials that advantageously affect toughness of the cured resist might adversely affect exposure time or development time or might cause the cured photoresist to become brittle.

SUMMARY OF THE INVENTION

According to the present invention there is provided in an aqueous-developable dry-film photoresist comprising a carboxyl-group containing film-forming polymeric binder, the improvement wherein the binder is obtained by polymerizing a mixture comprising: (a) a monomer of the formula $H_2C=CRCOO[(C_nH_{2n})X(C_pH_{2p})]_mR'$, wherein R is hydrogen or methyl and R' is a saturated or unsaturated $C_5$-$C_{12}$ bridged alkyl optionally substituted by at least one $C_1$-$C_4$ alkyl or halogen, X is oxygen or sulfur, n is 2–4, p is 0–4, m is 0–2; and (b) at least one $C_3$-$C_{15}$ $\alpha,\beta$-unsaturated carboxyl-containing or anhydride-containing monomer having 3–15 carbon atoms. The present invention is also an article comprising the dry-film photoresist disposed on a carrier, a method of using the dry-film photoresist, and a composition comprising the binder, a free-radical photo initiator, a polyfunctional addition-polymerizable monomer, a plasticizer, and a thermal polymerization inhibitor.

DETAILED DESCRIPTION OF THE INVENTION

The carboxyl-group containing film-forming polymeric binder useful in accordance with this invention is prepared using a minimum of two monomers. The first monomer a) has the formula $H_2C=CRCOO[(C_nH_{2n})X(C_pH_{2p})]_mR'$, wherein R is hydrogen or methyl and R' is a saturated or unsaturated $C_5$-$C_{12}$ bridged alkyl optionally substituted by at least one $C_1$-$C_4$ alkyl or halogen, X is oxygen or sulfur, n is 2–4, p is 0–4, m is 0–2. The saturated or unsaturated $C_5$-$C_{12}$ bridged alkyl group R' is a polycyclic hydrocarbon having 5–12 carbon atoms that contains a single or fused ring in which a valence bond, atom, or atom chain connects different parts of the ring. The $C_1$-$C_4$ alkyl group can be methyl, ethyl, propyl, isopropyl, n-butyl, or isobutyl, and halogen can be chloro, bromo, iodo, or fluoro. Examples of the optionally substituted bridged alkyl include single ring bridged systems such as isobornyl, bornyl, bornenyl, isobornenyl, norbornenyl, bicyclo[4.3.2]undecyl, tricyclo[5.3.1.1$^{2,6}$]dodecyl, tricyclo[3.2.1.0$^{2,7}$]octyl, 2-chloronorbornyl, 2,3-dichloronorbornyl, as well as fused ring bridged systems such as dicylcopentenyl, 1,2,3,4,4a,5,8,8a-octahydro-exo-1,4:exo-5,8-dimethanonaphthalene, 1,4-methanopentalenyl, 9,10-dihydro-9,10-ethanoanthracenyl,6,1,3-ethanylylidenecyclopenta[cd]pentalenyl. Methods for making the acrylates and methacrylates of the bridged groups named above are well known, such as by esterification of the alcohol of the bridged group with acrylic or methacrylic acid. Exemplary first monomers include isobornyl acrylate and methacrylate having the formula

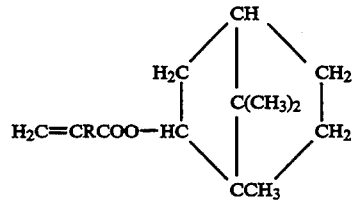

wherein R is as defined hereinabove, dicyclopentenyloxyethyl acrylate and methacrylate having the formula

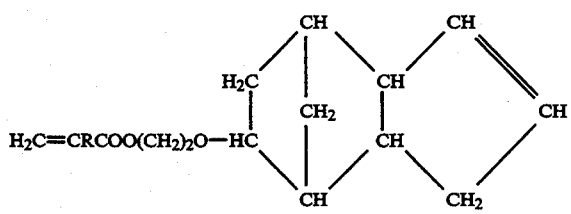

wherein R is as defined hereinabove, dicyclopentenyl acrylate and methacrylate having the formula

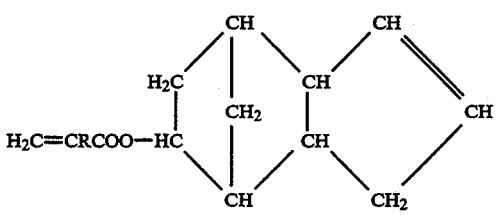

wherein R is as defined hereinabove. Other exemplary monomers include dicyclopentenylmethylthioethyl acrylate and methacrylate, norbornenyl acrylate and methacrylate, isobornyloxyethyl acrylate and methacrylate.

The second monomer (b) that is used to make the binder that is used in accordance with the present invention is at least one $C_3$-$C_{15}$ $\alpha,\beta$-unsaturated carboxyl-containing or anhydride-containing monomer having 3–15 carbon atoms. Examples of the useful carboxyl-containing monomers are cinnamic acid, crotonic acid, sorbic acid, acrylic acid, methacrylic acid, itaconic acid, propiolic acid, maleic acid, fumaric acid, and half esters and anhydrides of these acids. Acrylic acid and methacrylic acid are preferred.

Preferably, the binder used in accordance with the present is made using a third monomer (c). This third monomer can be a compound (i) $C_1$-$C_8$ alkyl acrylate or methacrylate, a compound (ii) $C_2$-$C_8$ hydroxyalkyl acrylate or methacrylate, or a compound (iii) styrene, $\alpha$-$C_1$-$C_6$ alkyl styrene, $\alpha$-halostyrene, or a ring-substituted derivative thereof. The compound (i) is any alkyl acrylate or methacrylate wherein the alkyl group is a straight or branched chain group having 1–8 carbon atoms, such as methyl, ethyl, propyl, sec-butyl, t-pentyl, n-hexyl, n-heptyl, or 2-ethylhexyl acrylate or methacrylate. The compound (ii) is any hydroxyalkyl acrylate or methacrylate wherein the hydroxyalkyl group is a straight or branched chain group having 2–8 carbon atoms, such as 2-hydroxyethyl, 2-hydroxypropyl, or 2-hydroxy-n-butyl acrylate or methacrylate. The compound (iii) is, for example, styrene, $\alpha$-methyl styrene, para-methyl styrene, or para-t-butyl styrene. The benzene ring of the compound (iii) can be substituted with, for example, 1–5 functional substituents selected from nitro, alkyl having 1–6 carbon atoms such as methyl, ethyl, or t-butyl, alkoxy having 1–6 carbon atoms, acyl having 1–6 carbon atoms, carboxyl having 1–6 carbon atoms, sulpho, hydroxyl, or halo such as fluoro, chloro, iodo, or bromo.

The binder used in accordance with the present invention can be made by known procedures, such as disclosed in U.S. Pat. No. 4,985,343, the disclosure of which is incorporated herein by reference. Preferably, the binder has a weight-average molecular weight of 40,000–200,000, more preferably 70,000–100,000, as determined by size-exclusion chromatography using polystyrene as the calibrating standard. In making the binder, the amount of the monomer (a) preferably varies from 15–50 weight %, more preferably 15–30 weight %, most preferably 20–29 weight %, based on the weight of the binder. The amount of the monomer (b) useful in making the binder varies from 15–50 weight %, more preferably 15–30 weight %, most preferably 18–32 weight %, based on the weight of the binder. The amount of the optional monomer (c) useful in making the binder varies from 0–40 weight %, more preferably 10–40 weight %, most preferably 15–35 weight %, based on the weight of the binder.

Polymeric binder-containing aqueous-developable dry-film photoresists are well known. Accordingly, in general, ingredients other than the specific polymeric binder disclosed herein that are useful in the aqueous-developable dry-film photoresist of the present invention will be readily apparent to the skilled artisan. In a preferred embodiment of the photoresist of the present invention there is included the polymeric binder, a free-radical photoinitiator, an addition-polymerizable monomer, and a thermal polymerization inhibitor. In a more preferred embodiment, the photoresist also contains a plasticizer. Optional additives such as dyes and adhesive promoting agents are also contemplated. "Dry" films are those in which the solvent has been evaporated. In the preferred embodiment, based on the total weight of the dry-film photoresist, the amount of polymeric binder varies from 40–70%, more preferably from 50–60%, the amount of photoinitiator varies from 0.5–10%, more preferably from 3–7%, the amount of addition-polymerizable monomer varies from 5–40%, more preferably 15–35%, the amount of plasticizer varies from 2–30%, more preferably from 9–15%, and the amount of thermal polymerization inhibitor varies from 0.003%–0.04%, more preferably from 0.01%–0.02%.

The plasticizer useful in accordance with the present invention can be any well known plasticizer in the photoresist art. Examples include polymeric and non-polymeric plasticizers. Non-polymeric plasticizers include, for example, tri-n-butyl citrate, N-ethyl-toluene sulfonamide, and glycerol triacetate. Polymeric plasticizers include the reaction product of (1) an isocyanate-terminated block copolymer of polyesterdiol blocks and polyalkylene glycol/ethylene oxide blocks and (2) at least one hydroxy-substituted acrylate or methacrylate, such as disclosed in U.S. Pat. No. 4,686,171, the disclosure of which is incorporated herein by reference. Carboxyl-modified polyurethanes are also useful plasticizers. Other useful plasticizers will be readily apparent to the skilled artisan.

The free-radical photoinitiator useful in accordance with this invention is a conventional photoinitiator activatable by actinic radiation that is thermally inactive below about 185° C. Examples of useful photoinitiators are found in U.S. Pat. No. 4,268,610, incorporated herein by reference. Exemplary photoinitiators are aromatic ketones, such as benzophenone and dimethoxyphenyl acetophenone, Michler's ketone, 4,4'-bis(diethylamino)benzophenone, tert-butylanthroquinone, 2-ethylanthraquinone, thiozanthones, benzoin alkyl ethers, and benzyl ketals. Other useful photoinitiators will be apparent to those skilled in the art.

The addition-polymerizable monomer useful in accordance with the present invention is a compound containing at least 1, preferably at least 2, more preferably 2 to 4, most preferably 2 to 3 ethylenic double bonds, or a mixture of said compounds. Suitable addition-polymerizable monomers include alkylene or polyalkylene glycol diacrylates. Monomers containing vinylidene groups conjugated with ester linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri- and tetraacrylate; tetraethylene glycol dimethacrylate; trimethylolpropane trimethacrylate; triethylene glycol diacrylate; tetraethylene glycol diacrylate; pentaerythritol triacrylate; trimethylol propane triacrylate; pentaerythritol tetraacrylate; 1,3-propanediol diacrylate; 1,5-pentanediol dimethacrylate; and the bis-acrylates and bis-methacrylates of polyethylene glycols, polypropylene glycols, and copolymers thereof of molecular weight from about 100 to about 500 (number average). Other useful addition-polymerizable monomers will be apparent to those skilled in the art.

The thermal polymerization inhibitor useful in accordance with the instant invention prevents thermal polymerization during drying and storage. Examples of useful thermal polymerization inhibitors are p-methoxyphenol, hydroquinone, alkyl and aryl-substituted hydroquinones and quinones, tertbutyl catechol, pyrogallol, copper resinate, $\beta$-naphthol, 2,6-di-tert-butyl-p-cresol, 2,2'-methylene-bis(4-ethyl-6-t-butylphenol), p-tolylquinone, chloranil, aryl phosphites, and aryl alkyl phosphites. Other useful thermal polymerization inhibitors will be apparent to those skilled in the art.

The photoresist of the present invention optionally includes additives well known in the art of photopolymerizable compositions, such as leuco (i.e., printout) dyes, background dyes, adhesion promoters, and antioxidants as disclosed in U.S. Pat. No. 4,297,435, incorporated herein by reference, and the heretofore mentioned U.S. Pat. No. 4,268,610. Other optional additives will be apparent to those skilled in the art. While desirable, the optional additives are not essential to the instant invention.

The photoresist of the present invention is prepared by mixing the various components in a solvent. Suitable solvents are alcohols, ketones, halogenated hydrocarbons, and ethers. Other solvents will be apparent to those skilled in the art. After mixing, the composition is then coated onto a support or carrier, and the solvent is evaporated. The photoresist has a preferable thickness of 10-100 $\mu$m, more preferably 12.2-50.8 $\mu$m. Carriers are preferably about 0.0254-0.0508 mm thick. U.S. Pat. Nos. 3,469,982 and 4,293,635, incorporated herein by reference, disclose useful methods for preparing the photopolymerizable composition of this invention, i.e., as rolls of dry film sandwiched between a flexible support member and a flexible cover member. It will be apparent to those skilled in the art that dry films of the instant invention can be made on inflexible supports as well as flexible supports and may be supplied as stacks of laminated sheets as disclosed in the heretofore mentioned U.S. Pat. No. 4,268,610, as well as rolls.

The photoresist of this invention is useful in the manufacture of printed circuit boards. Generally, the resist is coated onto the copper surface of a copper clad substrate, exposed to actinic radiation through a negative to create a latent image of photopolymerized material, and developed in a known aqueous developing solution to remove the unpolymerized composition from the copper surface. The portions of the surface not covered by the photopolymerized material are then modifiable by known processes, e.g., by plating or etching procedures, while the photoresist protects the covered surface. The photopolymerized material can be ultimately removed from the substrate by washing with known stripping solutions.

The photoresist of the present invention is applied to the copper clad substrate by known procedures, such as hot shoe or hot roll lamination of the dry film attached to a transparent, peelable support, which support is removed after polymerization, as disclosed in the heretofore mentioned U.S. Pat. No. 4,293,635. Generally, the amount of actinic radiation used to polymerize the composition varies from about 35 to about 150 mJ/cm$^2$, with precise amounts determinable by those skilled in the art based on the specific composition used.

The copper clad substrate is any known copper/dielectric laminate used in circuit board manufacture, such as a copper clad board of fiberglass reinforced epoxy resin. Other useful dielectrics will be apparent to those skilled in the art.

The aqueous developing solutions used in accordance with this invention have, by weight, about 0.5-10% alkaline agents, preferably about 0.5-1%, and the latent imaged board is washed in the solution for a time sufficient to remove the unpolymerized composition. Useful alkaline agents are alkali metal hydroxides, e.g., lithium, sodium and potassium hydroxide, the base reacting alkali metal salts of weak acids, e.g., sodium carbonate and bicarbonate, and alkali metal-phosphates and pyrophosphates. Sodium carbonate is preferred. The circuit board can be submerged in the developing solution or, preferably, the solution is high pressure sprayed on the board.

In general, the stripping solutions useful in removing the photopolymerized material in accordance with the instant invention are heated aqueous alkaline solutions, using the same alkaline agents as the developing solutions, but having a higher alkaline concentration, i.e., generally, by weight, from about 1%-10%, preferably from about 1%-3%. Generally, the stripping solution is heated to a temperature of about 45°-65° C., preferably about 50°-55° C. Washing the substrate to remove the photopolymerized material is by methods well known to those skilled in the art, such as spraying the substrate with the heated stripping solution or, preferably, agitating the substrate in a heated bath of the stripping solution.

Examples of the photoimaging techniques and equipment, including radiation sources, exposure intensity and duration, developing and stripping solutions and techniques, and laminated board composition useful in the preferred embodiment are disclosed in the heretofore described U.S. Pat. Nos. 3,469,982, 4,293,635, and 4,268,610.

The photoresist of the present invention is particularly useful in manufacturing operations on printing circuit boards involving alkaline etching and gold plating processes as well as chemical milling processes. The binder useful in accordance with the present invention imparts the toughness and resistance to ammoniacal chemistries needed during these operations. Alkaline etching and gold plating procedures are well known, such as disclosed in U.S. Pat. Nos. 3,705,061, 3,466,208, *Printed Circuits Handbook*, third edition (McGraw-Hill 1988), the disclosures of which are incorporated herein by reference.

In order to more clearly describe the present invention, the following non-limiting examples are provided. All parts and percentages in the examples are by weight unless indicated otherwise.

EXAMPLES 1-4

Photoresists are prepared and tested using polymeric binders, the compositions of which are recorded in the following Table 1.

TABLE 1

| Example | Monomer - Weight % | | | |
|---|---|---|---|---|
| | A[1] | B[2] | C[3] | D[4] |
| 1 | 22 | 36 | 13 | 29 |
| 2 | 22 | 29 | 20 | 29 |
| 3 | 22 | 32 | 17 | 29 |
| 4 | 22 | 29 | 28 | 17 |

[1] methyl acrylic acid
[2] methyl methacrylate
[3] ethyl acrylate
[4] isobornyl methacrylate Each binder is synthesized as follows. A reaction vessel is charged with 422 g methyl ethyl ketone and 555 g of the monomer mixture as in Table 1. While under a nitrogen atmosphere, the contents are stirred for about one hour while heating at about 80° C. The vessel is then charged with 7 ml of a solution having a concentration of 0.05 g azobisisobutyronitrile per 1 ml of methyl ethyl ketone. After 5 hours, 19 ml of a solution having a concentration of 0.05 g of azobisisobutyronitrile per 1 ml methyl ethyl ketone are added, and the polymerization allowed to continue for an additional nine hours. After polymerization is complete, the binder is placed in a glass container and methyl ethyl ketone added to bring the polymer solids content to 31%.

Photoresists are prepared from the formulations in the following Table 2 by adding to the 31% binder/solvent mixture the other ingredients recorded. Accordingly, the amount of binder recorded in the table includes the actual binder plus the solvent.

TABLE 2

| Example | Binder | Amounts - parts | | | | |
|---|---|---|---|---|---|---|
| | | ETMPAP[1] | EBAMA[2] | DEATT[3] | EDAB[4] | IPT[5] |
| 1 | 72.33 | 15.96 | 6.0 | 0.1 | 1.58 | 0.3 |
| 2 | 76.73 | 16.05 | 6.03 | 0.1 | 1.58 | 0.3 |
| 3 | 74.34 | 16.05 | 6.0 | 0.1 | 1.58 | 0.3 |
| 4 | 71.87 | 16.05 | 6.0 | 0.1 | 1.58 | 0.3 |

[1] Ethoxylated trimethylolpropane triacrylate
[2] Ethoxylated bisphenol A reacted with methacrylic acid, available under the name EBECRYL 3702 from Radcure Specialties, Inc., Louisville, KY.
[3] Diethanolamine-modified tolyl triazole, available from Ciba-Geigy under the name REOMET 42.
[4] Ethyl dimethylaminobenzoate.
[5] Isopropyl thioxanthone.

The photoresists are made as follows. Materials as in Table 2 are stirred in a propeller mixer at about 600 rpm. The mixture is then centrifuged for 3 minutes to remove the air bubbles. Drawdowns are made of the mixtures at a thickness of about 38.1 μm on a 92 guage polyester substrate and then dried in an oven at 100° C. for 3-6 minutes. Drawdowns are laminated to a degreased and scrubbed double-sided copper pannel (56.7 g copper on an dielectric base) having a thickness of about 0.79 mm on a hot-roll laminator at a temperature of about 121° C., a pressure of about 2.1 kg/cm², and a speed of about 121.9 cm/min. The panels are exposed imagewise (through a negative) at an exposure corresponding to Stouffer step 6-7 using a 21 Stouffer Step Guide. The panels are held for 15 minutes and then passed through a Chemcut 547 developer at a speed adjusted to give a 50% breakpoint in a developing solution of 0.90% w/w aqueous sodium carbonate monohydrate at a temperature of about 35° C., a top spray pressure of about 1.41 kg/cm², and a rinse pressure of about 1.41 kg/cm².

Panels are then placed in a conveyorized spray etcher (Chemcut 547) having an etch chamber about 91.4 cm long, a pollution control section about 61 cm long, and a rinse section about 30.5 cm long having a temperature of about 49° C. Etcher speed for the panels exposed at a Stouffer step of 6-7 is 45.72 cm/min for 1 pass and 91.44 cm/min for a second pass. The etcher speed is adjusted such that 1 pass gives about 90% complete etching, and the second pass completes the etch, leaving no residual copper. The etchant used is MacDermid ULTRAETCH 50 Etchant, which gives an optimum etch rate at a concentration of 427.95-570.6 g of copper per 3.785 l of etchant, 4.5-5.0 ppm chloride and a pH of 8-8.5. The replenishment chamber (pollution control chamber) is filled with MacDermid ULTRAETCH 50 Replenisher Solution (ammonium hydroxide and ammonium chloride mixture) giving the pollution control chamber a pH of 11. In operation, the replenisher solution is sprayed on the panels after coming out of the etch chamber. The solution then cascades into the etch chamber.

Etched panels are evaluated for resistance to the alkaline etchant by measuring resist adhesion. Adhesion is visually checked by the adherence of a series of lines having a width of 40, 50, 60, 70, 80, 90, 100, 125, 150, 200, and 250 μm, with a 250 μm spacing between each line. The performance of the resist is based on the smallest line held at each etch speed. The smaller the line held indicates the greater resistance to the alkaline etchant. The smallest line held for each Example is recorded in the following Table 3.

TABLE 3

| Example | Line width (μm) |
|---|---|
| 1 | 70 |
| 2 | 90 |
| 3 | 125 |
| 4 | >250 |

EXAMPLES 5-9

Photoresists are prepared using binder formulations as in the following Table 4.

TABLE 4

| Example | Monomer - Weight % | | | |
|---|---|---|---|---|
| | A[1] | B[2] | C[3] | D[4] |
| 5 | 22 | 36 | 12 | 29 |
| 6 | 22 | 35 | 14 | 29 |
| 7 | 22 | 33 | 16 | 29 |
| 8 | 26 | 36 | 21 | 17 |
| 9 | 22 | 39 | 10 | 29 |

[1] methyl acrylic acid
[2] methyl methacrylate
[3] butyl acrylate
[4] isobornyl methacrylate Binders and photoresists are prepared as in Examples 1-4 using the formulations in the following Table 5.

TABLE 5

| Example | Binder | Amounts - parts | | | | |
|---|---|---|---|---|---|---|
| | | ETMPAP* | EBAMA* | DEATT* | EDAB* | IPT* |
| 5 | 72.52 | 16.05 | 6.03 | 0.1 | 1.58 | 0.3 |
| 6 | 74.19 | 16.05 | 6.03 | 0.1 | 1.58 | 0.3 |
| 7 | 69.96 | 16.05 | 6.03 | 0.1 | 1.58 | 0.3 |
| 8 | 82.47 | 16.05 | 6.03 | 0.1 | 1.58 | 0.3 |
| 9 | 74.97 | 16.05 | 6.03 | 0.1 | 1.58 | 0.3 |

*As in Examples 1-4.

Photoresists are exposed, developed, etched, and tested as in Examples 1-4. The results are recorded in the following Table 6.

TABLE 6

| Example | Line width (μm) |
|---|---|
| 5 | 80 |
| 6 | 150 |
| 7 | 50 |
| 8 | 90 |
| 9 | 80 |

EXAMPLES 10-14

Photoresists are prepared using binder formulations as in the following Table 7.

TABLE 7

| Example | Monomer - Weight % | | | |
|---|---|---|---|---|
| | A[1] | B[2] | C[3] | D[4] |
| 10 | 22 | 36 | 13 | 29 |
| 11 | 22 | 58 | 13 | 6 |
| 12 | 22 | 52 | 13 | 13 |
| 13 | 22 | 39 | 13 | 26 |
| 14 | 22 | 26 | 13 | 39 |

[1] methyl acrylic acid
[2] methyl methacrylate
[3] ethyl acrylate
[4] dicyclopentenyloxyethyl methacrylate Binders and photoresists are prepared as in Examples 1-4 using the formulations in the following Table 8.

TABLE 8

| Example | Binder | Amounts - parts | | | | |
|---|---|---|---|---|---|---|
| | | ETMPAP* | EBAMA* | DEATT* | EDAB* | IPT* |
| 10 | 61.20 | 14.86 | 4.51 | 0.1 | 1.58 | 0.3 |
| 11 | 61.20 | 14.86 | 4.51 | 0.1 | 1.58 | 0.3 |
| 12 | 61.20 | 14.86 | 4.51 | 0.1 | 1.58 | 0.3 |
| 13 | 61.20 | 14.86 | 4.51 | 0.1 | 1.58 | 0.3 |
| 14 | 61.20 | 14.86 | 4.51 | 0.1 | 1.58 | 0.3 |

*As in Examples 1-4.

Photoresists are exposed, developed, etched, and tested as in Examples 1-4. The results are recorded in the following Table 9.

TABLE 9

| Example | Line width (μm) |
|---|---|
| 10 | 50 |
| 11 | 90 |
| 12 | 80 |
| 13 | 60 |
| 14 | 60 |

EXAMPLES 15-18

Photoresists are prepared using binder formulations as in the following Table 10.

TABLE 10

| Example | Monomer - Weight % | | | |
|---|---|---|---|---|
| | A[1] | B[2] | C[3] | D[4] |
| 15 | 22 | 36 | 13 | 29 |
| 16 | 22 | 58 | 13 | 6 |
| 17 | 26 | 52 | 13 | 13 |
| 18 | 22 | 39 | 13 | 26 |

[1] methyl acrylic acid
[2] methyl methacrylate
[3] ethyl acrylate
[4] dicyclopentenyloxyethyl acrylate Binders and photoresists are prepared as in Examples 1-4 using the formulations in the following Table 11.

TABLE 11

| Example | Binder | Amounts - parts | | | | |
|---|---|---|---|---|---|---|
| | | ETMPAP* | EBAMA* | DEATT* | EDAB* | IPT* |
| 15 | 57.35 | 14.86 | 4.51 | 0.1 | 1.58 | 0.3 |
| 16 | 61.20 | 14.86 | 4.52 | 0.1 | 1.58 | 0.3 |
| 17 | 61.20 | 14.86 | 4.51 | 0.1 | 1.58 | 0.3 |
| 18 | 61.20 | 14.86 | 4.51 | 0.1 | 1.58 | 0.3 |

*As in Examples 1-4.

Photoresists are exposed, developed, etched, and tested as in Examples 1-4. The results are recorded in the following Table 12.

TABLE 12

| Example | Line width (μm) |
|---|---|
| 15 | 40 |
| 16 | 70 |
| 17 | 125 |
| 18 | 70 |

Claimed is:

1. A photopolymerizable composition comprising an addition-polymerizable monomer and a film-forming polymeric binder, wherein the binder is obtained by polymerizing a mixture comprising:
  (a) a monomer of the formula $H_2C=CRCOO[(C_nH_{2n})X(C_pH_{2p})]_mR'$, wherein R is hydrogen or methyl; R' is selected from the group consisting of isobornyl, bornyl, bornenyl, isobornenyl, norbornenyl, bicycloundecyl, tricyclododecyl, tricyclooctyl, 2-chloronorbornyl, 2,3-dichloronorbornyl; X is oxygen or sulfur, n is 2–4, p is 0–4, m is 0–2;
  (b) at least one $\alpha,\beta$-unsaturated carboxyl-containing or anhydride-containing monomer having 3–15 carbon atoms;
  (c) at least one $C_1$-$C_8$ alkyl acrylate; and
  (d) at least one $C_1$-$C_8$ alkyl methacrylate.

2. The composition of claim 1 further comprising a free-radical photoinitiator, a plasticizer, and a thermal polymerization inhibitor.

3. The composition of claim 1 wherein the addition-polymerizable monomer is polyfunctional.

4. The composition of claim 1 wherein the addition-polymerizable monomer is selected from the group consisting of alkylene or polyalkylene glycol diacrylates.

5. The composition of claim 1 wherein the addition-polymerizable monomer is selected from the group consisting of ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri-and tetraacrylate; tetraethylene glycol dimethacrylate; trimethylolpropane trimethacrylate; triethylene glycol diacrylate; tetraethylene glycol diacrylate; pentaerythritol triacrylate; trimethylolpropane triacrylate; pentaerythritol tetraacrylate; 1,3-propanediol diacrylate; 1,5-pentanediol dimethacrylate; the bis-acrylates and bis-methacrylates of polypropylene glycols and copolymers of polyethylene glycols and polypropylene glycols of molecular weight from about 100 to about 500 (number average).

6. The composition of claim 2 further comprising a solvent.

7. The photopolymerizable composition of claim 1 wherein the compound (c) is at least one monomer selected from the group consisting of methyl acrylate, ethyl acrylate, propyl acrylate, sec-butyl acrylate, hexyl acrylate and 2-ethylhexyl acrylate.

8. The photopolymerizable composition of claim 7 wherein the monomer of formula $H_2C=CRCOO[(C_nH_{2n})X(C_pH_{2p})]_mR'$ is selected from the group consisting of isobornyl acrylate, isobornyl methacrylate, isobornyloxyethyl acrylate, and isobornyloxyethyl methacrylate.

9. The photopolymerizable composition of claim 8 wherein the at least one $C_3$-$C_{15}$ $\alpha,\beta$-unsaturated carboxyl-containing or anhydride-containing monomer having 3–15 carbon atoms is selected from the group consisting of cinnamic acid, crotonic acid, sorbic acid, acrylic acid, methacrylic acid, itaconic acid, propionic acid, maleic acid, fumaric acid, and half esters and anhydrides of these acids.

10. The photopolymerizable composition of claim 1 wherein the addition polymerizable monomer is selected from the group consisting of glycerol diacrylate, glycerol triacrylate, trimethylolpropane trimethacrylate, triethylene glycol diacrylate, and trimethylolpropane triacrylate.

11. The photopolymerizable composition of claim 10 wherein the film forming binder is obtained by polymerizing a mixture comprising isobornyl methacrylate, methacrylic acid, ethyl acrylate and methyl methacrylate.

12. The composition of claim 2 wherein the addition-polymerizable monomer is present at a level of 5–40 weight percent, the polymeric binder is present a level of 40–70 weight percent, the free-radical photoinitiator is present at a level of 0.5–10 weight percent, the plasticizer is present at a level of 2–30 weight percent, and the thermal polymerization inhibitor is present at a level of 0.003–0.04 weight percent.

13. The composition of claim 12 wherein the addition-polymerizable monomer is present at a level of 15–35 weight percent, the polymeric binder is present a level of 50–60 weight percent, the free-radical photoinitiator is present at a level of 3–7 weight percent, the plasticizer is present at a level of 9–15 weight percent, and the thermal polymerization inhibitor is present at a level of 0.01–0.02 weight percent.

14. The photopolymerizable composition of claim 1 wherein the binder is obtained by polymerizing methacrylic acid, methyl methacrylate, ethyl acrylate and isobornyl methacrylate.

15. The composition of claim 13 wherein the binder is obtained by polymerizing a mixture comprising 20–40 weight percent of the monomer of formula $H_2C=CRCOO[(C_nH_{2n})X(C_pH_{2p})]_mR'$, 18–32 weight percent of at least one $C_3$-$C_{15}$ $\alpha,\beta$-unsaturated carboxyl-containing or anhydride-containing monomer having 3–15 carbon atoms, 13–25 weight percent of at least one $C_1$-$C_8$ alkyl acrylate, and 29–40 weight percent of at least one $C_1$-$C_8$ alkyl methacrylate.

16. The photopolymerizable composition of claim 1 wherein the compound (d) is at least one monomer selected from the group consisting of methyl methacrylate, ethyl methacrylate, propyl methacrylate, sec-butyl methacrylate, hexyl methacrylate and 2-ethylhexyl methacrylate.

17. The photopolymerizable composition of claim 7 wherein the compound (d) is at least one monomer selected from the group consisting of methyl methacrylate, ethyl methacrylate, propyl methacrylate, sec-butyl methacrylate, hexyl methacrylate and 2-ethylhexyl methacrylate.

* * * * *